United States Patent
Park et al.

(10) Patent No.: US 6,221,742 B1
(45) Date of Patent: Apr. 24, 2001

(54) METHOD FOR FABRICATING POLYSILICON FILM FOR SEMICONDUCTOR DEVICE

(75) Inventors: Young-wook Park, Suwon; Cha-young Yoo; Young-sun Kim, both of Yongin; Seung-hee Nam, Seoul, all of (KR)

(73) Assignee: Samsung Electronics Co., LTD, Suwon (KR)

( * ) Notice: Subject to any disclaimer, the term of this patent is extended or adjusted under 35 U.S.C. 154(b) by 0 days.

(21) Appl. No.: 09/146,260

(22) Filed: Sep. 3, 1998

Related U.S. Application Data

(62) Division of application No. 08/871,452, filed on Jun. 9, 1997, now Pat. No. 6,039,811.

(30) Foreign Application Priority Data

Jun. 8, 1996 (KR) .................................................. 96-20441

(51) Int. Cl.[7] .................................................. H01L 21/20
(52) U.S. Cl. ........................ 438/488; 438/239; 438/255; 438/398; 438/488; 438/396; 257/309
(58) Field of Search .......................... 427/118; 118/725, 118/715, 728, 719; 438/489, 255, 398, 488, 239, 396; 257/309

(56) References Cited

U.S. PATENT DOCUMENTS

| | | | |
|---|---|---|---|
| 5,658,381 | * 8/1997 | Thakur et al. | 257/309 |
| 5,721,171 | * 2/1998 | Ping et al. | 438/398 |
| 5,733,809 | * 3/1998 | Dennison et al. | 438/253 |
| 5,760,434 | * 6/1998 | Zahurak et al. | 257/309 |
| 5,837,580 | * 12/1998 | Thakur et al. | 438/225 |
| 5,851,602 | * 12/1998 | Law et al. | 427/579 |
| 5,940,713 | * 8/1999 | Green | 438/396 |
| 6,027,970 | * 2/2000 | Sharan et al. | 438/255 |

\* cited by examiner

*Primary Examiner*—Matthew Smith
*Assistant Examiner*—Belur V Keshavan
(74) *Attorney, Agent, or Firm*—Jones Volentine, L.L.C.

(57) ABSTRACT

An apparatus for fabricating a semiconductor device having cooling jackets for preventing a gas from being exuded in a reaction chamber, thereby minimizing the generation of contaminating particles. The apparatus includes a reaction chamber having four cooling jackets respectively mounted on a first side wall adjacent to a wafer transfer chamber, a second side wall opposite to the first side wall, an upper wall and a bottom wall. A gate valve is disposed between the reaction chamber and the wafer transfer chamber and has a fifth cooling jacket. While fabricating a polysilicon film using the above apparatus, a pressure of a cassette chamber is controlled to be less than about 0.05 mtorr. Alternatively, a pressure of a cooling chamber and the wafer transfer are both controlled to be less than about 1.0 μtorr.

14 Claims, 14 Drawing Sheets

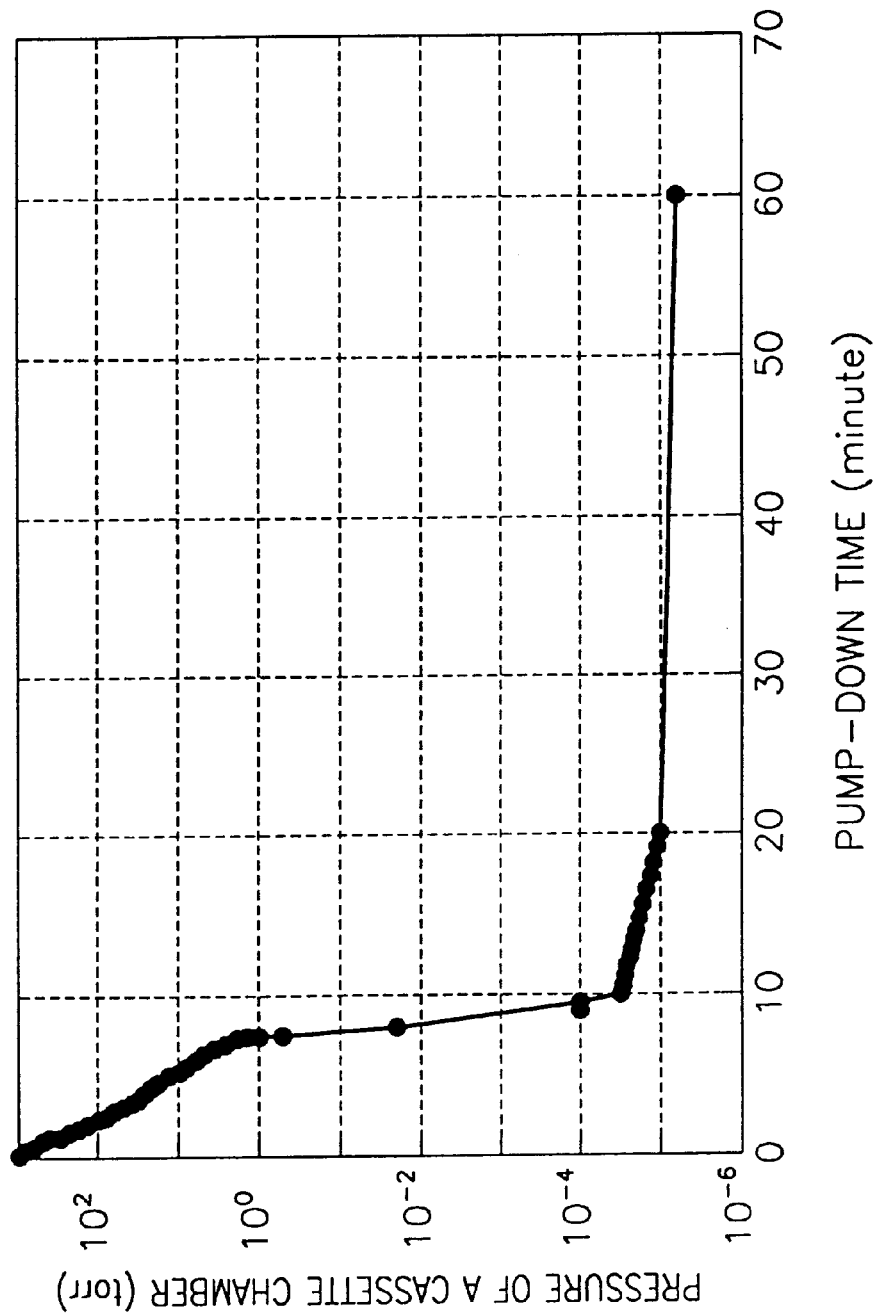

METHOD FOR FABRICATING POLYSILICON FILM FOR SEMICONDUCTOR DEVICE

CROSS REFERENCE TO RELATED APPLICATIONS

This is a divisional application of application Ser. No. 08/871,452, filed Jun. 9, 1997 now U.S. Pat. No. 6,039,811.

BACKGROUND OF THE INVENTION

1. Field of the Invention

The present invention relates to an apparatus and method for fabricating a polysilicon film for a semiconductor device.

2. Description of the Related Art

To manufacture a reliable semiconductor device:, one must keep the temperature of the apparatus uniform and minimize any contaminating particles.

Specifically, consider the case of forming a lower electrode with a hemispherical silicon grain (referred to as HSG-Si), in order to enlarge the electrostatic capacitance of a capacitor by increasing the area of the lower electrode. In this situation, it is critical to keep the temperature of the reaction chamber uniform and to keep the inside of the reaction chamber clean and free of contaminants.

Typically, to form the lower electrode with HSG-Si, a crystal growing step for forming crystal grains by migrating the amorphous silicon to the nucleus of crystalline silicon needs to be stable. Also, the speed of silicon surface migration for the growth of the crystal grain needs to be faster than the speed of the amorphous silicon crystallization in the lower amorphous silicon.

For the amorphous silicon to move toward the nucleus of the crystalline silicon, the amorphous silicon should have a free surface where the silicon atoms of the surface are not combined to any other atoms. When the surface is contaminated with other materials, the surface movement of the amorphous silicon atoms is impeded since the amorphous silicon atoms combine to the atoms of the other materials, thus making any further generation and growth of the nucleus impossible. Therefore, removing the surface contaminants on the wafer that is transferred to the reaction chamber, and keeping the inside of the chamber clean are important factors in semiconductor processing.

A general apparatus for fabricating the semiconductor device includes a cassette chamber in which a carrier having a wafer is loaded. The apparatus also contains a reaction chamber for performing a process, and a wafer cooling chamber after completing the process. A polyhedral transfer chamber having a robot arm is connected to the reaction chamber and cooling chambers for transferring the wafer to the respective chambers.

The structure of the reaction chamber is described as follows with reference to FIG. 1. A gate valve 31 that separates a wafer transfer chamber 10 and a reaction chamber 20 is disposed between the first side wall 30 of the reaction chamber and the wafer transfer chamber 10. A gas vent opening 33 is formed on a second side wall 32 opposite to the first side wall 30. A gas injection opening 35 is formed to pass through an upper wall 34 of the reaction chamber. Cooling jackets 40 and 42 are installed on the upper 34 and bottom 36 walls of the reaction chamber. A heating block 24, having a heater 22 and a susceptor 26 for sustaining a wafer 28 on the heating block 24, are installed inside the reaction chamber 20. Also, a turbo pump 38 is connected to the second side wall 32.

The operation of the apparatus of FIG. 1 will now be described. First, the wafer is transferred to the reaction chamber 20 after being transferred from the cassette chamber (not shown) and the wafer transfer chamber 10 by the robot arm. The pressure of the cassette chamber at the beginning of the transfer is about 1 mtorr.

However, air at a pressure of about 1 mtoor, which contains polluting particles, is also transferred from the cassette chamber to the wafer transfer chamber when the wafer is transferred. Therefore, the wafer transfer chamber is contaminated with the polluting particles. As a result, the reaction chamber 20 connected to the wafer transfer chamber 10 is also contaminated with the polluting particles. The surface of the wafer is thus contaminated by these polluting particles, such as moisture and carbon compounds, during the process of raising the temperature of the wafer 28 in the reaction chamber 20, thus reducing the reliability of the processing. Especially, in the case of forming the lower electrode with the HSG-Si, it is impossible to increase the surface area since the speed of the surface migration of the amorphous silicon is reduced by adsorption of contaminants to the amorphous silicon.

In the next steps, the surface of the wafer 28 is cleaned to remove an organic material or a native oxide film existing on the surface of the wafer prior to the processing in the reaction chamber 20. Therefore, a certain amount of moisture exists on the surface of the wafer 28 which is loaded in the cassette chamber (not shown) and the moisture is not completely evaporated and removed in the cassette chamber under the pressure of 1mtorr. Therefore, vapor is continuously generated when the wafer 28 is transferred from the wafer transfer chamber 10 to the reaction chamber 20. Especially in a process for forming the HSG-Si, the speed of the surface migration of the amorphous silicon is reduced by the vapor which is continuously generated.

Typically, a cooling gas, such as argon or helium is injected into a cooling chamber (not shown) at a pressure of 1 to 100 torr. The cooling gas flows into the wafer transfer chamber 10 connected to the cooling chamber, and then flows into the reaction chamber 20, thus acting as a contaminant. As before, the speed of the surface migration of the amorphous silicon is reduced since the surface of the wafer 28 is contaminated by the cooling gas.

As shown in FIG. 1, the reaction chamber includes the cooling jackets 40 and 42 for keeping the temperature uniform on the upper and bottom walls 34 and 36 thereof. However, the temperature of the gate valve 31 separating the transfer chamber 10 and the reaction chamber 20, the first side wall 30 adjacent to the gate valve 31 and the second side wall 32 opposite to the first side wall 30, are all approximately 50° C. or higher than the upper 34 and bottom 36 walls, since the above three portions have no cooling jackets. Thus, the surface contaminants existing on the chamber walls and the wafer may exude in a gas form from the gate valve 31, the first side wall 30, and the second side wall 32. Especially in the case of the process for forming the HSG-Si, it is impossible to achieve the desired surface increase effect since the exuded gas is adsorbed to the surface of the silicon.

SUMMARY OF THE INVENTION

The present invention is directed to an apparatus for fabricating a semiconductor device and associated methods using such an apparatus, which substantially overcomes the limitations and disadvantages of the conventional art.

To achieve such advantages, the apparatus for fabricating the semiconductor device according to the present invention comprises a cassette chamber, a wafer transfer chamber, a reaction chamber and a wafer cooling chamber. First, second, third and fourth cooling jackets are installed on a first side wall adjacent to the wafer transfer chamber, a second side wall opposite to the first side Mall, an upper wall, and a bottom wall, respectively. A gate valve is disposed between the reaction chamber and the wafer transfer chamber to separate the reaction chamber from the wafer transfer chamber. The gate valve has a fifth cooling jacket thereon. A wafer cooling chamber is connected to a side portion of the wafer transfer chamber.

A polysilicon film is fabricated with the above apparatus by adjusting the pressure of the cassette chamber to be less than 0.05 mtorr. Alternatively, the pressures of the cooling chamber and the wafer transfer chamber may be controlled to be less than 1.0 μtorr. A refrigerant, selected from the group consisting of cooling water, and mixture of the cooling water and ethylene glycol, is provided to the first through fifth cooling jackets of the above apparatus.

BRIEF DESCRIPTION OF THE DRAWINGS

The above objects and advantages of the present invention will become more apparent by describing in detail a preferred embodiment thereof with reference to the attached drawings in which:

FIG. 4 is a graph showing the relation between pumping down time and cassette chamber pressure;

DETAILED DESCRIPTION OF THE INVENTION

The semiconductor device fabricating apparatus of the present invention will first be described, followed by various methods for fabricating a polysilicon film using the disclosed apparatus.

Semiconductor Device Fabricating Apparatus

Figure 2:
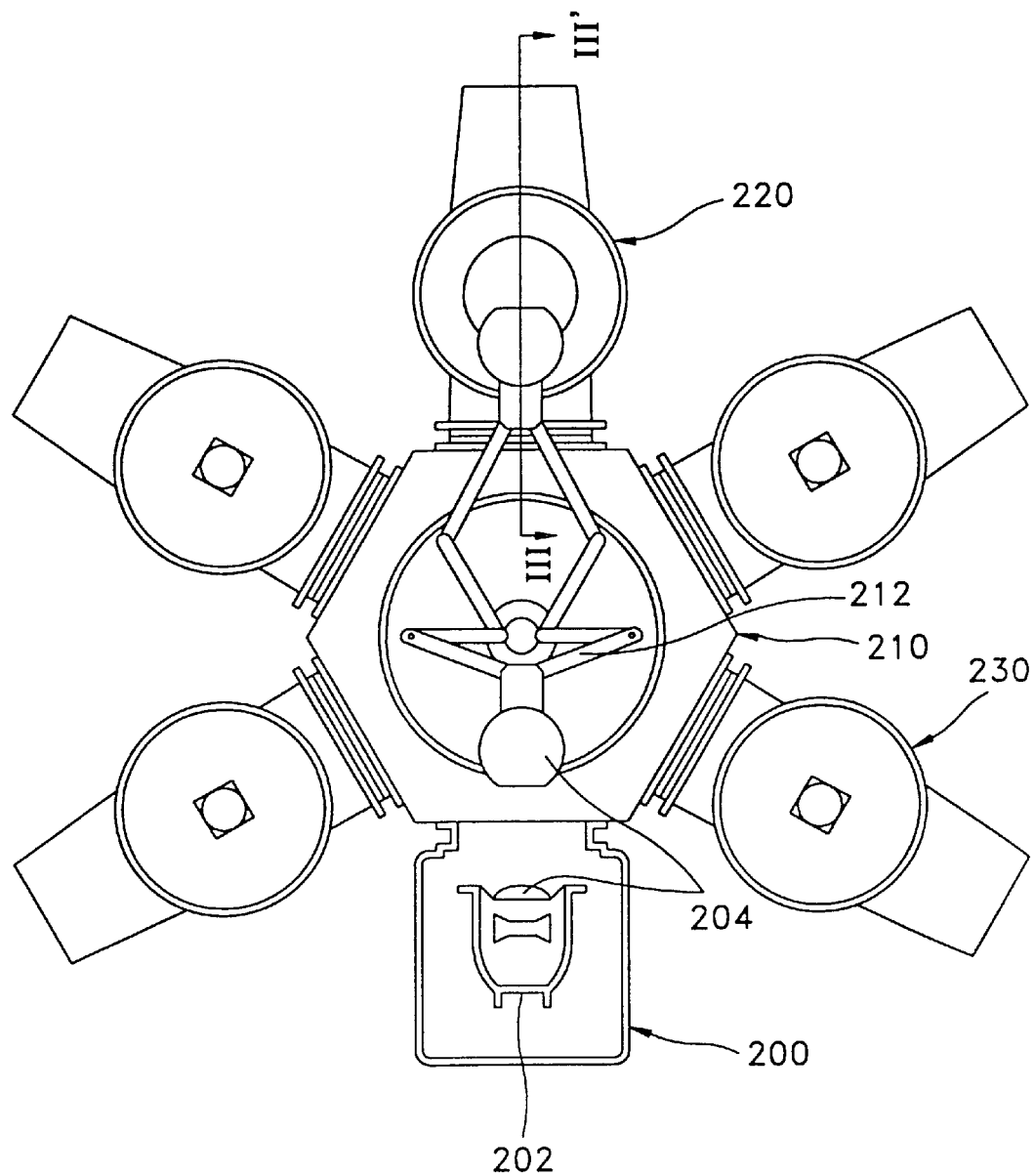
FIG. 2 is a plan view of a semiconductor device fabricating apparatus according to an embodiment of the present invention.

FIG. 2 is a plan view of a semiconductor device fabricating apparatus according to a preferred embodiment of the present invention.

Referring to FIG. 2, the semiconductor device fabricating apparatus includes a cassette chamber 200, with a carrier 202 having a wafer 204 loaded therein, with the cassette chamber 200 separating the carrier 202 from atmosphere. A wafer transfer chamber 210, having a robot arm 212, transfers the wafer 204 to a reaction chamber 220, where a process for fabricating a semiconductor device proceeds. A wafer cooling chamber 230 cools the wafer after the fabricating process is complete.

Five cooling jackets are installed on the reaction chamber 220 according to the embodiment of the present invention. They are described in detail with reference to FIG. 3 showing an exaggerated sectional view of the reaction chamber 220 taken along the line III–III' of FIG. 2.

Figure 3:
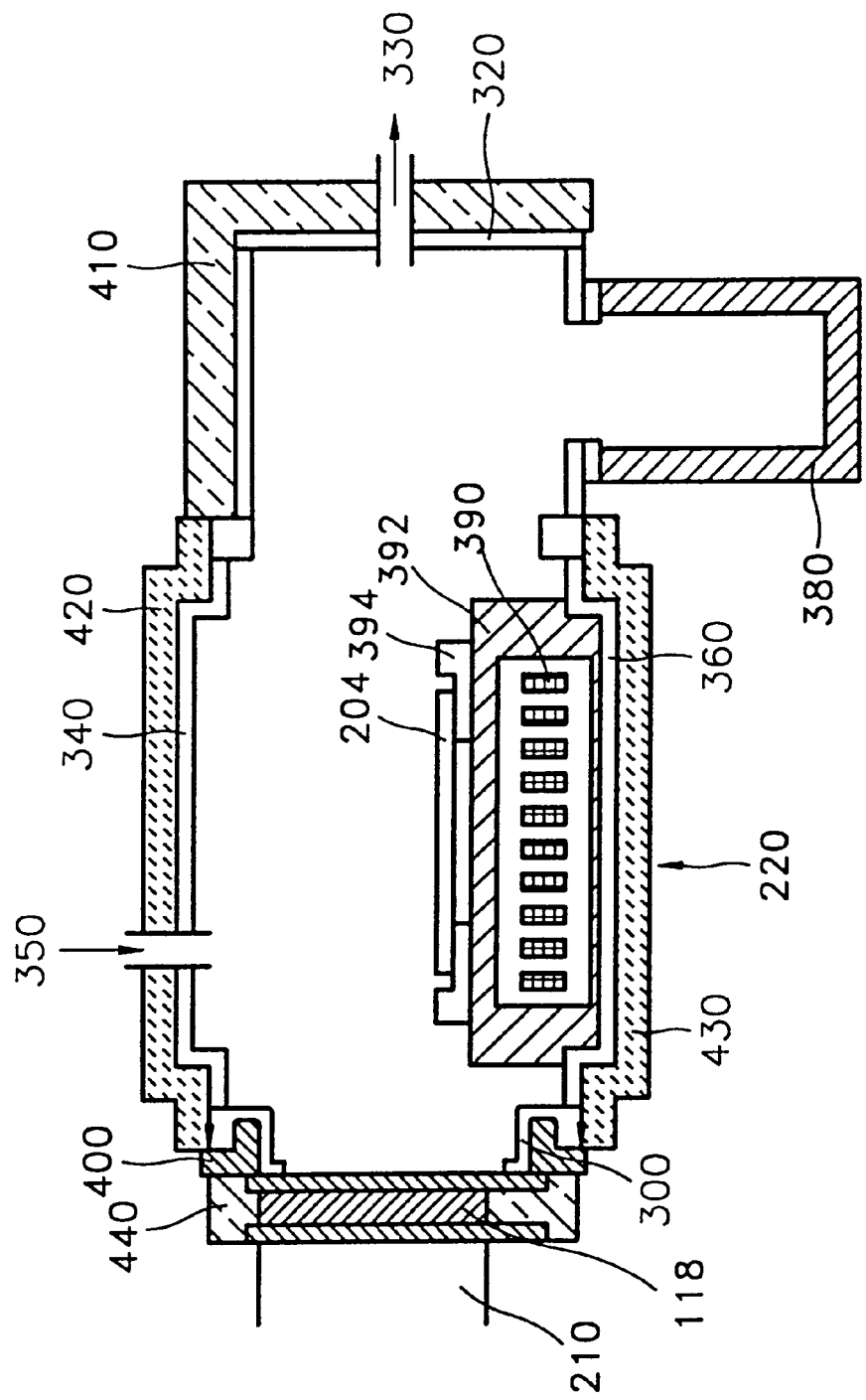
FIG. 3 is a sectional view of the reaction chamber taken along the line III–Ill' of FIG. 2.

Referring to FIG. 3, a gate valve 118 formed on a first side wall 300 separates the wafer transfer chamber 210 from the reaction chamber 220. A first cooling jacket 400 and a second cooling jacket 410 are respectively formed on a first side wall 300 and a second side wall 320. A gas injection opening 350 is formed to pass through an upper wall of the reaction chamber 340. A third cooling jacket 420 is formed on the upper wall of the reaction chamber 340. A fourth cooling jacket 430 is also formed outside of a bottom wall 360 of the reaction chamber 220. A heating block 392 inside the reaction chamber 220 contains a heater 390 and a susceptor 394 for sustaining the wafer 204 on the heating block 392. A turbo pump 380 is connected to the second side wall 320. A fifth cooling jacket 440 is formed on the surface of the gate valve 118.

A refrigerant, selected from the group consisting of cooling water and a mixture of the cooling water and ethylene glycol, is preferably used in the first to the fifth cooling jackets 400, 410, 420, 430, and 440. Also, it is preferable that the refrigerant have a temperature substantially less than 9° C., thus making the temperature in the reaction chamber 220 substantially less than 10° C.

In the semiconductor device fabricating apparatus according to the embodiment of the present invention, since the cooling jackets are installed on all the walls, including the upper and bottom walls of the reaction chamber, it is possible to prevent gas from being exuded from the chamber walls by supplying the refrigerant to the respective cooling jackets during the processing in the reaction chamber.

Method for Fabricating A Polysilicon Film

FIRST EMBODIMENT

The first embodiment of the polysilicon film fabricating method according to the present invention is as follows. The multi-chamber type semiconductor device fabricating apparatus shown in FIG. 2 is used in the first embodiment. In this embodiment, the reaction chamber does not have to include five cooling jackets as shown in FIG. 3, it being sufficient to include only two cooling jackets on the upper 34 and bottom 36 walls.

After loading the semiconductor wafer 204 for forming the polysilicon film in the cassette chamber 200, the pressure of the cassette chamber 200 is adjusted to less than 0.05 mtorr by performing a pumping down operation for more than ten minutes. The reason why the pumping down should be performed for more than ten minutes is shown in FIG. 4, since the maximum pressure decrease is achieved in the first ten minutes.

The robot arm 212 transfers the wafer 204 from the cassette chamber 200 to the reaction chamber 220 via the wafer transfer chamber 210. The polysilicon film is formed by injecting a source (reactant) gas into the reaction chamber, with the gas being selected from the group consisting of silane, disilane, and the gas mixture in which silane and disilane are mixed in the 30:1 to 1:30 ratio. The HSG-Si is thereafter formed by performing a thermal treatment thereon. The polysilicon film is preferably used as a lower electrode of the capacitor.

By keeping the pressure of the cassette chamber 200 to less than 0.05 mtorr, the influx of the atmospheric contaminants into the wafer transfer chamber 210 is prevented. Also, the moisture, generated by the wet pre-processing that removes the native oxide film or organic material on the surface of the wafer, can be completely evaporated from the surface of the wafer. Therefore, the problem that the remaining moisture on the surface of the wafer evaporates in the wafer transfer chamber or the reaction chamber and acts as a contaminant is solved since the influx of the contaminant gas into the wafer transfer chamber 210 or the reaction chamber 220 is prevented.

SECOND EMBODIMENT

The second embodiment of the polysilicon film fabricating method according to the present invention is different from the first embodiment in that the pressure of the cassette chamber 200 is not controlled, but the pressure of the wafer cooling chamber 230 is controlled to be about equal to that of the wafer transfer chamber 210.

In particular, in this embodiment, the wafer whose reaction is completed is cooled in the cooling chamber 230 after adjusting the pressure of the wafer cooling chamber 230 to be equal to that of the wafer transfer chamber 210 without injecting a cooling gas. The pressure of the wafer cooling chamber 230 and the wafer transfer chamber 210 is preferably kept to less than about 1 $\mu$torr. If the wafer is cooled in the wafer cooling chamber 230 without using the cooling gas, the pressures of the wafer transfer chamber and the reaction chamber do not increase since we do not inject the pressure of the cooling gas. Therefore, the problem that an increased pressure of the reaction chamber results in contamination of the surface of the wafer during the step of heating the wafer may be prevented.

THIRD EMBODIMENT

In the third embodiment of the present invention, the polysilicon film is fabricated using the reaction chamber shown in FIG. 3, including all the cooling jackets 400, 410, 420, 430 and 440.

First, the wafer for forming the polysilicon film is loaded in the cassette chamber 200. The robot arm 212 places the wafer on the susceptor 394 in the reaction chamber 220 through the wafer transfer chamber 210. Then, the temperature of the reaction chamber 220 is raised to a certain temperature by the heater 390 in the heating block 392.

The amorphous silicon film is formed to a predetermined thickness on the wafer using a source gas selected from the group consisting of silane, disilane, and the gas mixture in which silane and disilane are mixed in the 30:1 to 1:30 ratio. The polysilicon film is completed by forming the HSG-Si using a thermal treatment on the wafer on which the amorphous silicon film is formed. The polysilicon film is preferably used as a lower electrode of the capacitor.

When the process proceeds in the reaction chamber 220, the problem that gas is exuded from the walls of the cooling chamber is prevented by supplying the refrigerant to the first to fifth cooling jackets 400, 410, 420, 430, and 440. Therefore, according to the third embodiment, it is possible to form the polysilicon film whose area is enlarged to a maximum extent.

The characteristics of the present invention are described in detail with reference to the following examples. However, the present invention is not restricted to the examples, and it is clearly understood that many variations can be made within the scope and spirit of the present invention by anyone skilled in the art.

EXAMPLE 1

A wafer having an insulating layer with a contact hole exposing a source region has already been formed and loaded on a susceptor 394 in the semiconductor device fabricating apparatus shown in FIG. 3. The capacitor having an enlarged surface area is fabricated by forming an amorphous silicon layer to the thickness of 3000 Å by flowing the disilane gas. The HSG-Si is then formed by flowing the disilane gas at a rate of 18 sccm on the surface of the amorphous silicon layer while keeping the temperature of wafer to 620° C. During the above process, the temperature of the walls of the wafer cooling chamber are kept to about 10° C. by flowing the 9° C. refrigerant into the first to the fifth cooling jackets 400, 410, 420, 430 and 440.

Figure 5A:
FIGS. 5A to 5E are scanning electron microscope photographs of the surface of a capacitor lower electrode formed by a method for fabricating a polysilicon film according to a first embodiment of the present invention and formed in the positions of the wafer shown in FIG. 5F.
Figure 5B:
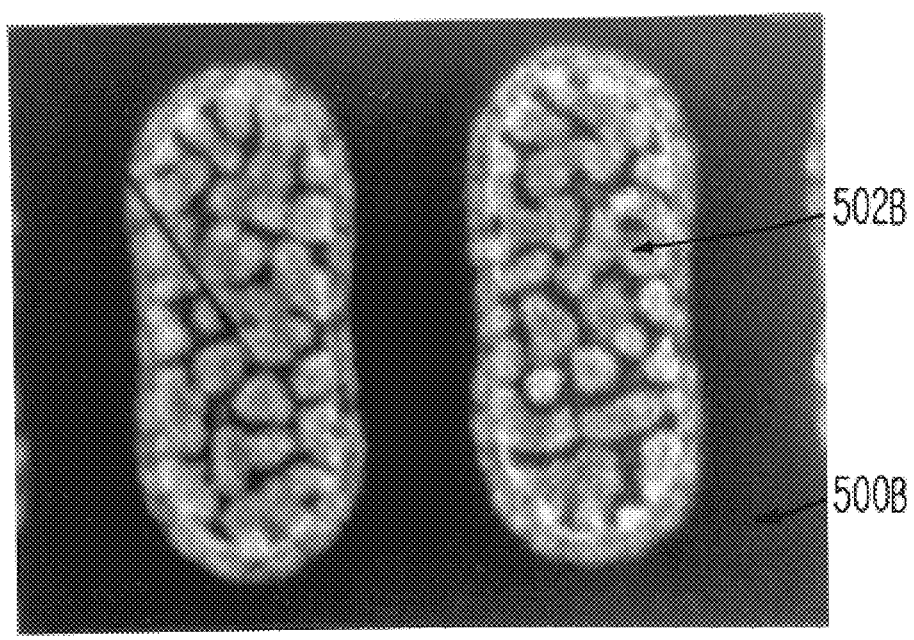
Figure 5C:
Figure 5D:
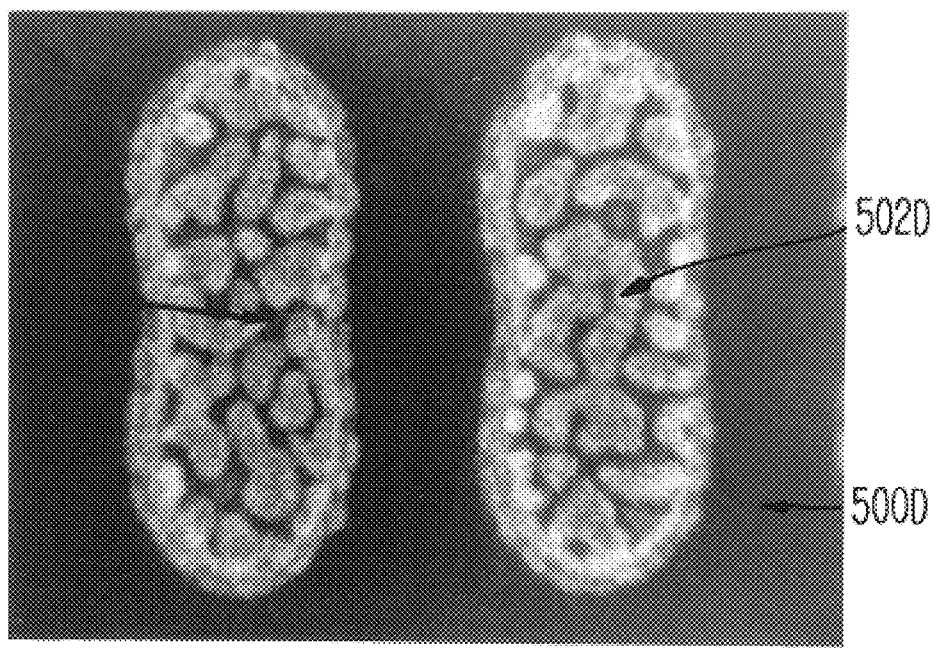
Figure 5E:
Figure 5F:
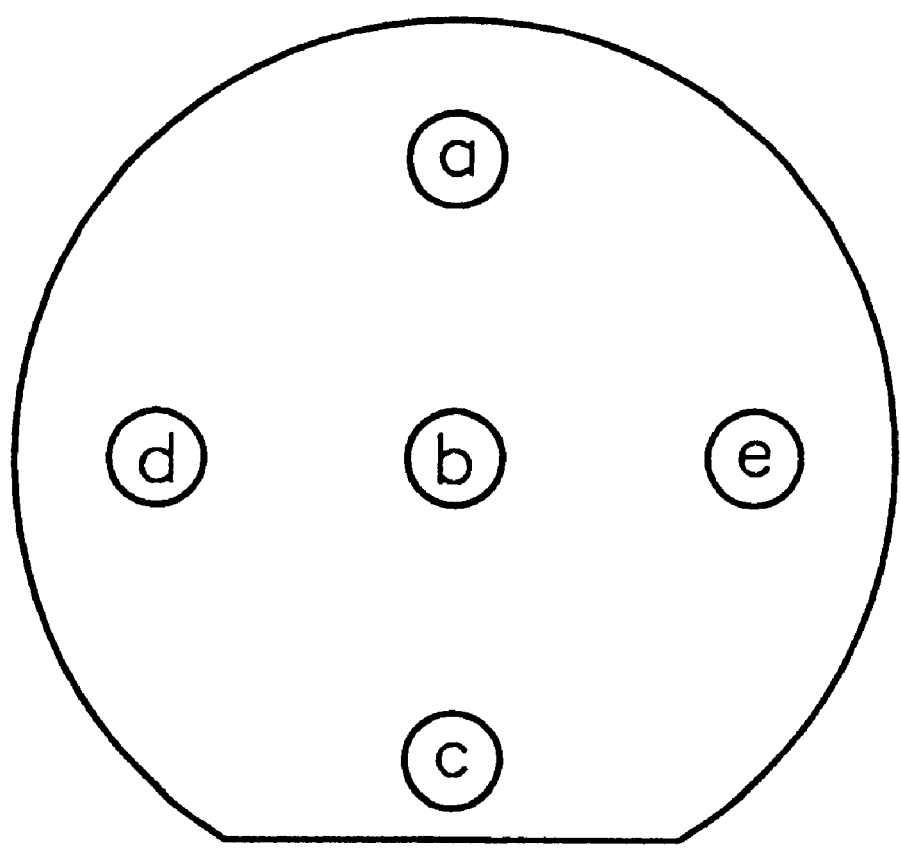

The scanning electron microscope (SEM) photographs of the lower electrode of the capacitor formed by the above process are shown in FIGS. 5A to 5E. FIGS. 5A to 5E show the photographs of the surface of the lower electrode of the capacitor formed in the positions of the wafer shown in FIG. 5F, respectively. Reference numerals 500A, 500B, 500C, 500D, and 500E respectively denote the insulating layers. Reference numerals 502A, 502B, 502C, 502D, and 502E respectively denote the surfaces of the lower electrodes on which the HSG-Si is formed. As noted from the above photographs, the surface area is maximized regardless of the position of the wafer on which the lower electrode is formed since HSG-Si is uniformly formed on the surface of the lower electrode.

Figure 1:
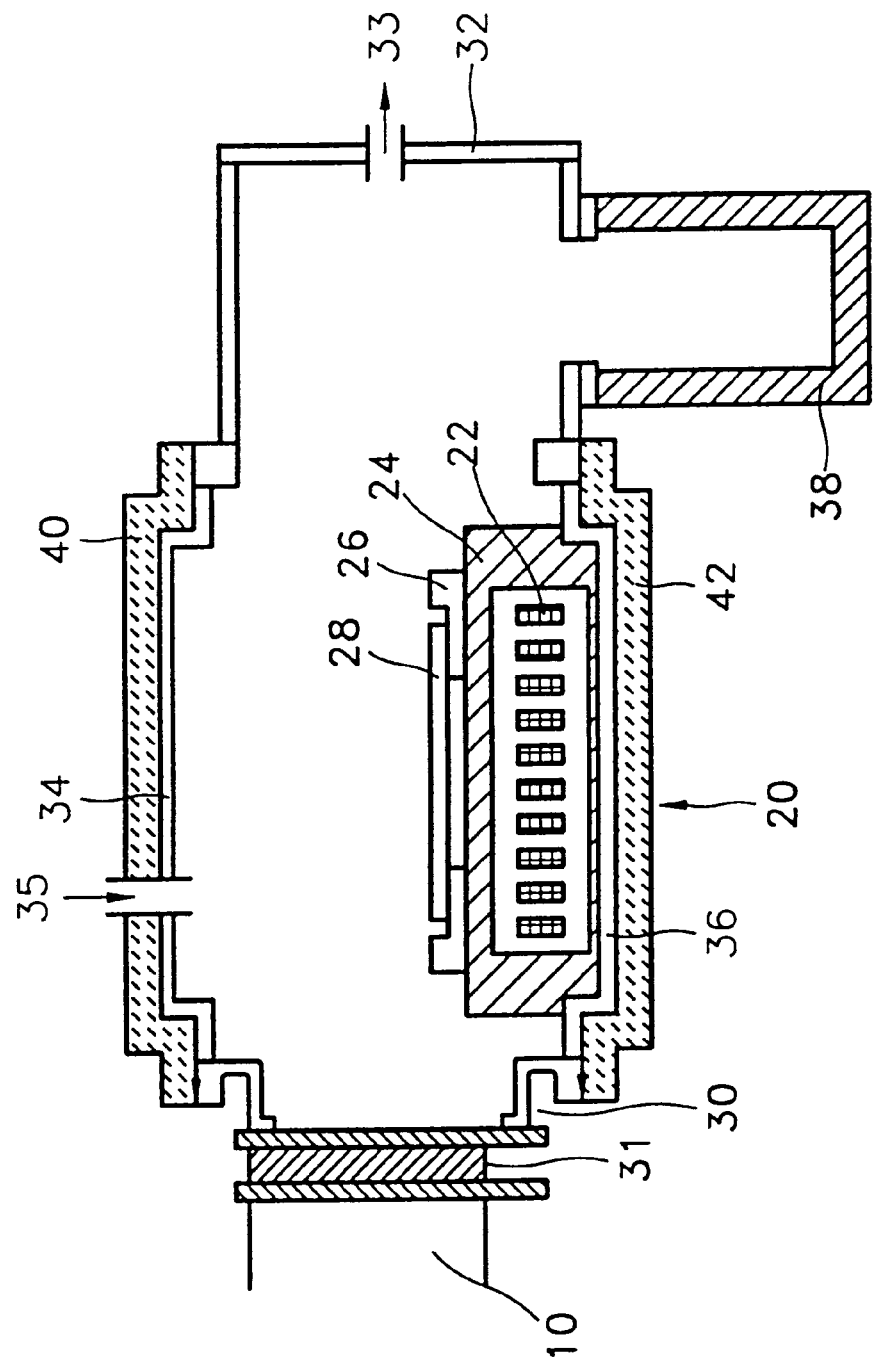
FIG. 1 is a sectional view of a reaction chamber of a conventional semiconductor device fabricating apparatus.
Figure 6A:
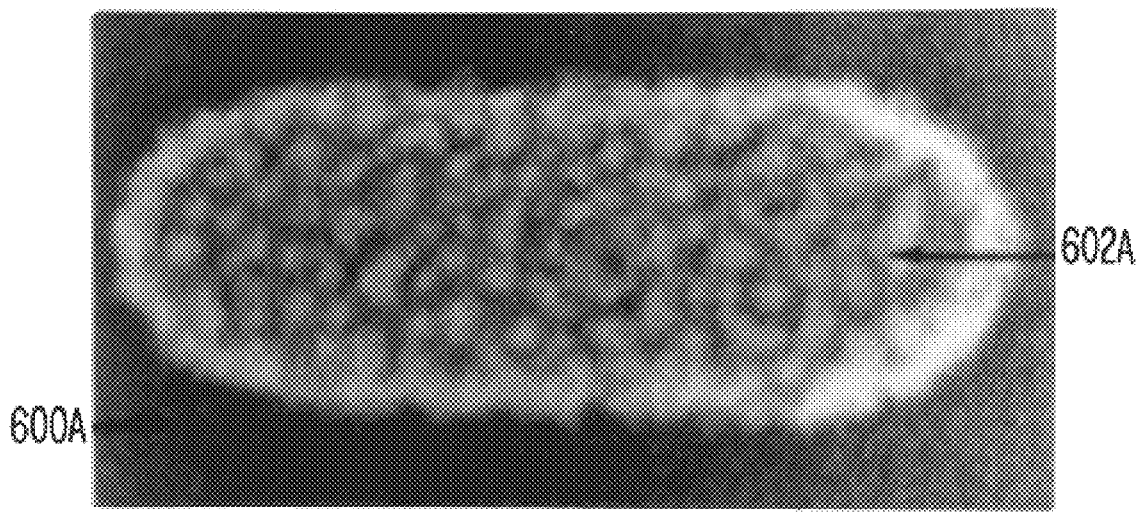
FIGS. 6A and 6B are scanning electron microscope photographs of the surface of the capacitor lower electrode formed by a conventional semiconductor device fabricating apparatus, as a contrast group to the first embodiment.
Figure 6B:
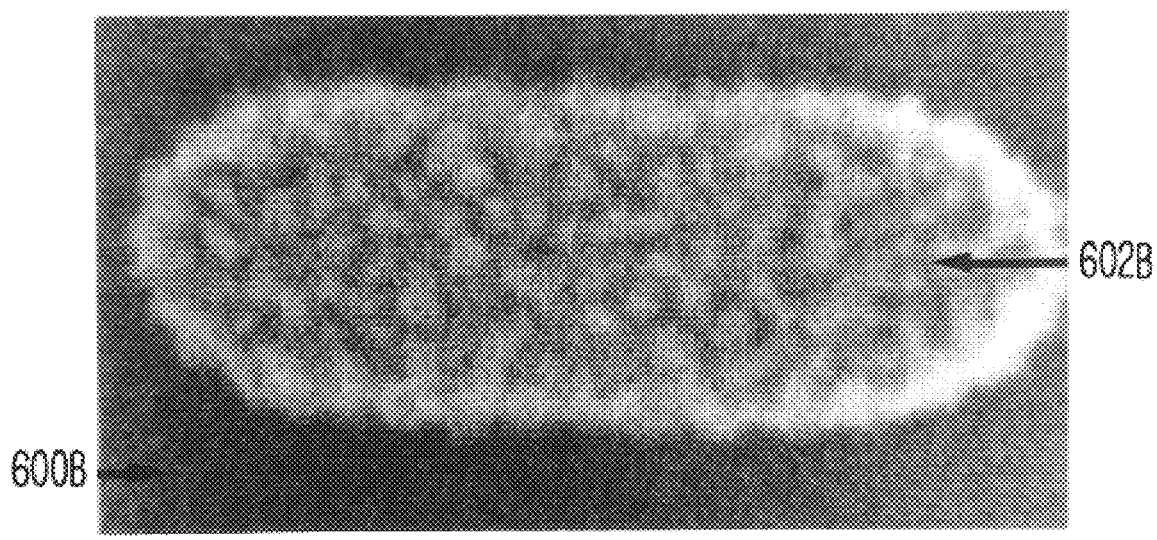

To clearly check and compare the gas exudation feature of the present invention to that of the conventional art, the lower electrode of the capacitor is also formed in the conventional semiconductor device fabricating apparatus shown in FIG. 1, after controlling the processing conditions, such as reaction gas and temperature, to be equal to that of the present invention. The SEM photographs of the lower electrodes of a contrast group are shown in FIGS. 6A and 6B. FIGS. 6A and 6B respectively show the lower electrode formed in the reaction chamber which is adjacent to the wafer transfer chamber and the lower electrode formed in the reaction chamber which is adjacent to a vent portion. The reference numerals 600A and 600B respectively denote the insulating films. The reference numerals 602A and 602B respectively denote the surfaces of the lower electrodes on which the HSG-Si is formed. It is noted that there exist the portions in which the formation of the surface flection degrades.

When the lower electrode of the capacitor is formed using the semiconductor device fabricating apparatus according to the present invention, the temperature of the walls of the reaction chamber, especially, the gate valve 118, the first wall 300 to which the gate valve 118 is connected, and the second wall 320 on which the vent portion is formed, can be kept low. Therefore, the problem that the formation of the surface flection degrades as the speed of the surface movement decreases due to the exuded gas is overcome since the gas exudation from the chamber walls is prevented.

EXAMPLE 2

To examine the relations between the pressure of the cassette chamber and the pressure of the wafer transfer chamber, and between the pressure of the cassette chamber and the pressure of the reaction chamber, the pressure between the respective chambers are measured and provided in Table 1 below:

TABLE 1

|  | cassette chamber | wafer transfer chamber | | reaction chamber | |
| --- | --- | --- | --- | --- | --- |
|  |  | initial pressure | changed pressure | initial pressure | changed pressure |
| contrast group | 0.1 mtorr | 0.23 $\mu$torr | 2.2 $\mu$torr | 7.3 ntorr | 20 ntorr |
| experimental group | 0.02 mtorr | 0.23 $\mu$torr | 0.23 $\mu$torr | 7.3 ntorr | 13 ntorr |

As noted from the results of the experimental group, in the case of controlling the pressure of the cassette chamber to about 0.02 mtorr, even though the gate valves between the cassette chamber 200 and the wafer transfer chamber 210 and between the cassette chamber 200 and the reaction chamber 220 are opened, the pressure in the wafer transfer chamber does not increase.

The lower electrode with the HSG-Si is also formed by depositing the amorphous silicon film after adjusting the pressure of the cassette chamber to be 0.05 mtorr and flowing the disilane source gas at a rate of 18 sccm while keeping the temperature of the wafer at 620° C. The SEM photograph of the surface of the lower electrode is shown in FIG. 7A.

Figure 7A:
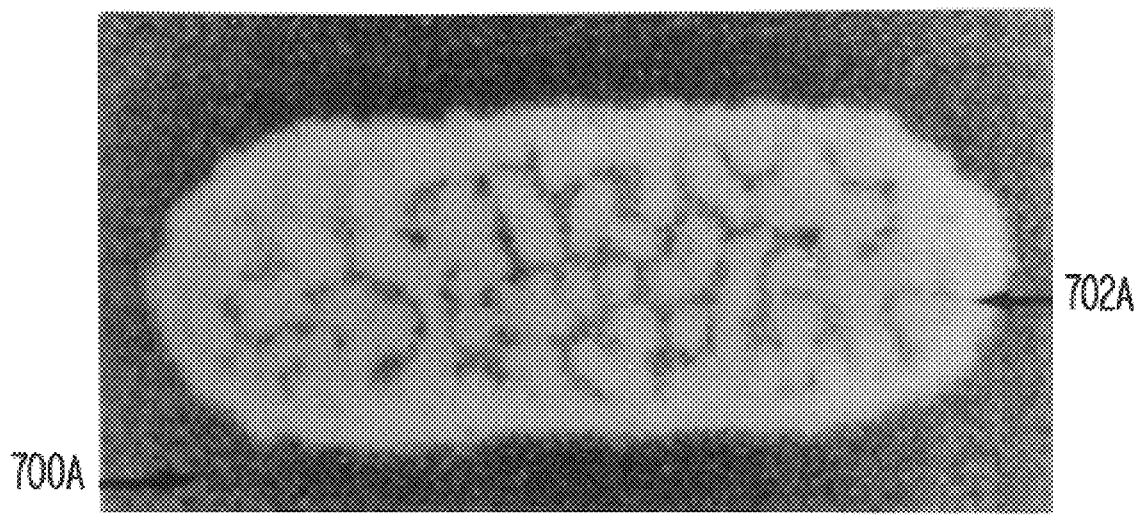
FIG. 7A is a scanning electron microscope photograph of the surface of the capacitor lower electrode formed by a method for fabricating a polysilicon film according to a second embodiment of the present invention.
Figure 7B:
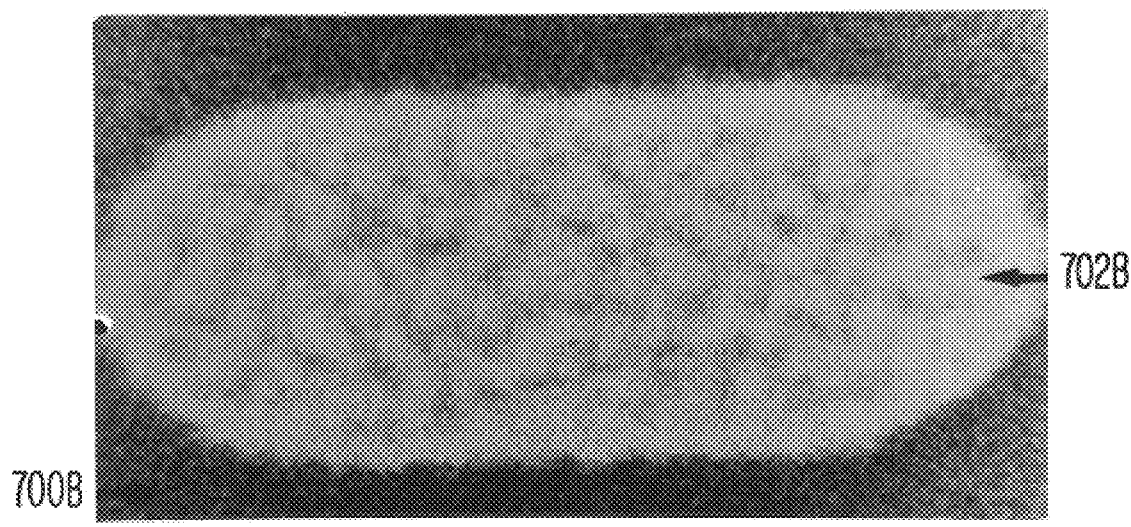
FIG. 7B is a scanning electron microscope photograph of the surface of the capacitor lower electrode formed by a conventional silicon film fabricating method, as a contrast group to the second embodiment.

As a comparison, FIG. 7B shows the SEM photograph of the lower electrode formed by controlling the pressure of the cassette chamber to about 0.1mtorr and controlling the other conditions to be equal to those of the example of FIG. 7A of the present invention. The reference numerals 700A and 700B respectively denote the insulating layers. The reference numerals 702A and 702B respectively denote the surfaces of the lower electrodes.

As noted from FIG. 7A, while it is possible to form a uniform HSG-Si on the surface of the lower electrode in the case of controlling the pressure of the cassette chamber to be 0.05 mtorr according to the present invention, the degradation of the surface flection is generated as shown from FIG. 7B by the atmospheric contaminants and the evaporated vapor from the wafer as in the conventional technology.

Figure 8:
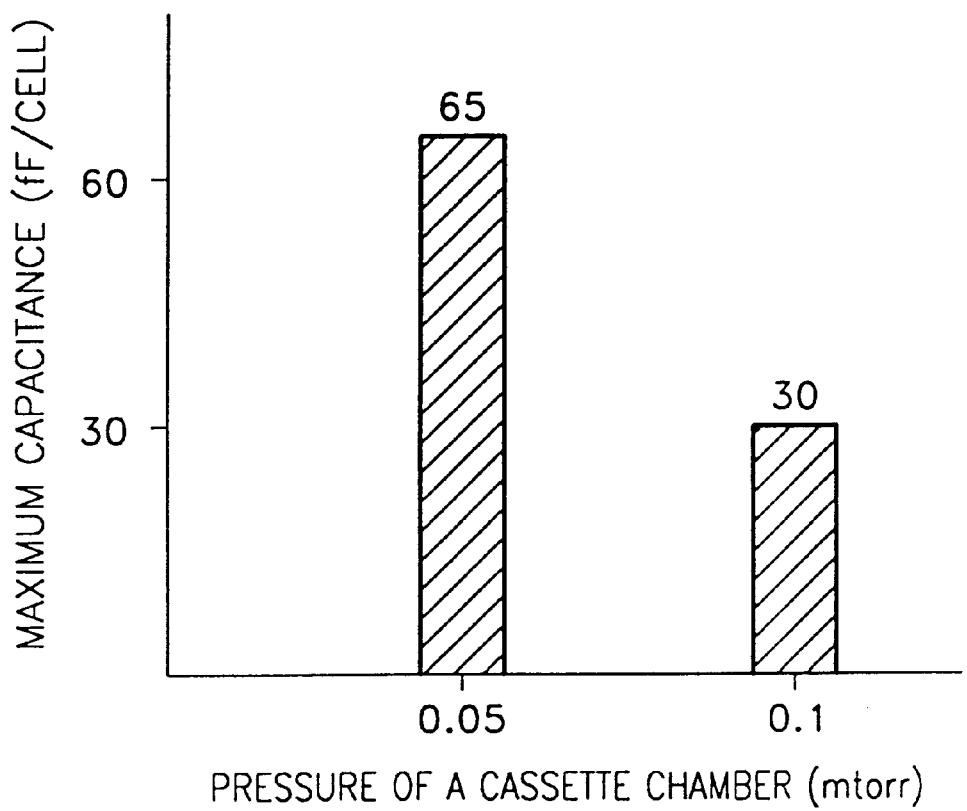
FIG. 8 is a bar graph showing the value of the maximum capacitance of the capacitor shown in FIGS. 7A and 7B.

FIG. 8 is a bar graph showing the value of measuring the maximum capacitance of the capacitor shown in FIGS. 7A and 7B. This result shows the mean value of the maximum capacitance measured from 10 wafers. As noted from the graph, the capacitance of the capacitor formed by the present inventions is 65(fF/cell), which is twice that of the capacitor formed by the conventional technology, i.e., 30(fF/cell).

EXAMPLE 3

To examine the relations between the pressure of the cooling chamber 230 and the pressure of the wafer transfer chamber 210, and between the pressure of the cooling chamber 230 and the pressure of the reaction chamber 220, the pressure between the respective chambers are measured and provided in Table 2 below:

TABLE 2

|  | wafer cooling chamber | wafer transfer chamber | | reaction chamber | |
| --- | --- | --- | --- | --- | --- |
|  |  | initial pressure | changed pressure | initial pressure | changed pressure |
| contrast group | 240 mtorr | 0.25 $\mu$torr | 2.3 $\mu$torr | 7.3 ntorr | 2.3 $\mu$torr |
| experimental group | 1 $\mu$torr | 0.25 $\mu$torr | 0.25 $\mu$torr | 7.3 ntorr | 15 ntorr |

As noted from the results of the contrast group, in the case of cooling the wafer in the wafer cooling chamber, the injected cooling gas raises the pressure of the wafer transfer chamber (0.25 $\mu$torr→2.3 $\mu$torr). Also, when transferring the wafer to the reaction chamber to perform another process on the wafer, the cooling gas raises the pressure of the reaction chamber (7.3 ntorr→2.3 $\mu$torr). Such an increased pressure causes contamination of the surface of the wafer.

In the experimental group, where the cooling of the wafer in the wafer cooling chamber is carried out under a pressure that is about equal to that of the wafer transfer chamber, i.e., 1 $\mu$torr without injecting the cooling gas, there is no change in the pressure in the wafer transfer chamber 210 and a slight change in the pressure in the reaction chamber 220, thus suppressing the contamination of the reaction chamber 220.

Figure 9A:
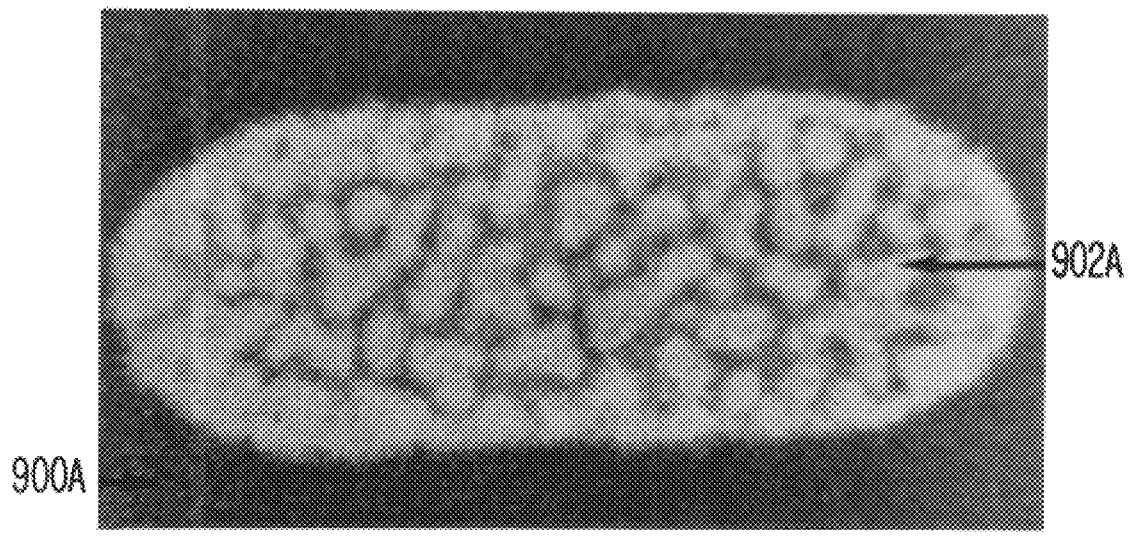
FIG. 9A is a scanning electron microscope photograph of the surface of the capacitor lower electrode formed by a polysilicon film fabricating method according to a third embodiment of the present invention.

FIG. 9A is a SEM photograph of the surface of the lower electrode, in which the HSG-Si is formed by depositing the amorphous silicon film after equalizing the pressure of the wafer cooling chamber and the wafer transfer chamber at about 1 $\mu$torr, and having a source gas of disilane flowing at a rate of 18 sccm while keeping the wafer temperature at about 620° C.

Figure 9B:
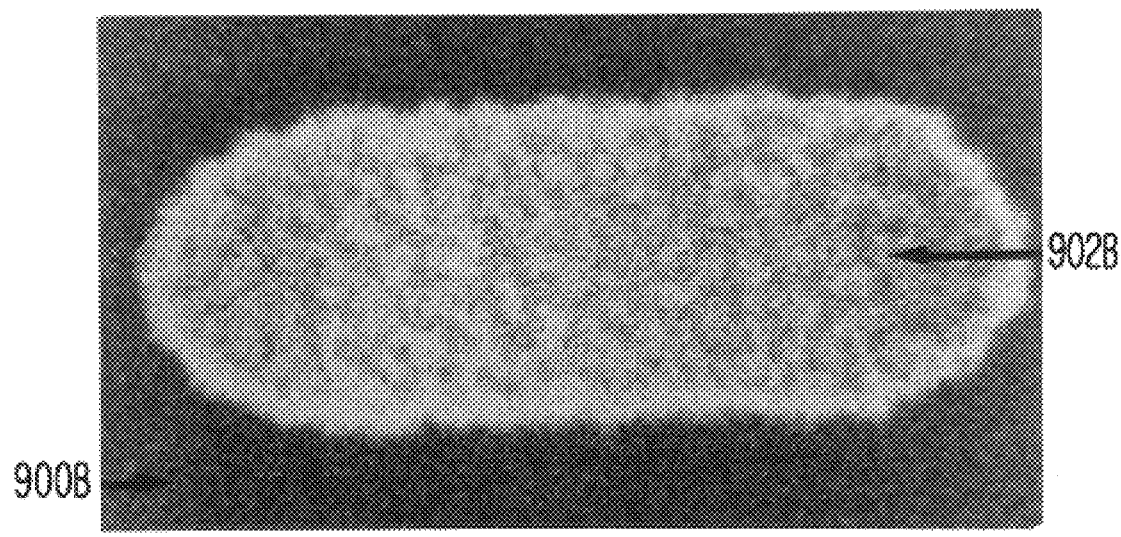
FIG. 9B is a scanning electron microscope photograph of the surface of the capacitor lower electrode formed by a conventional polysilicon film fabricating method, as a contrast group to the third embodiment.

FIG. 9B is a SEM photograph of the lower electrode formed by injecting argon at a pressure of 240 mtorr as the cooling gas and controlling the other conditions to be equal to those of the example in FIG. 9A. The reference numerals 900A and 900B denote the insulating layers. The reference numerals 902A and 902B denote the surface of the lower electrode.

It is noted from the result of FIG. 9A that a flection is uniformly formed on the surface of the amorphous silicon when the pressure of the wafer cooling chamber and the wafer transfer chamber are both kept under 1 $\mu$torr. It is also noted from the result of FIG. 9B that it is impossible to obtain a desirable surface flection effect due to the reduction of the speed of the surface migration of the amorphous silicon atoms to the crystalline silicon when the wafer is cooled in the wafer cooling chamber using the cooling gas and the pressure of the wafer cooling chamber is higher than 1 µtorr.

EXAMPLE 4

Figure 10B:
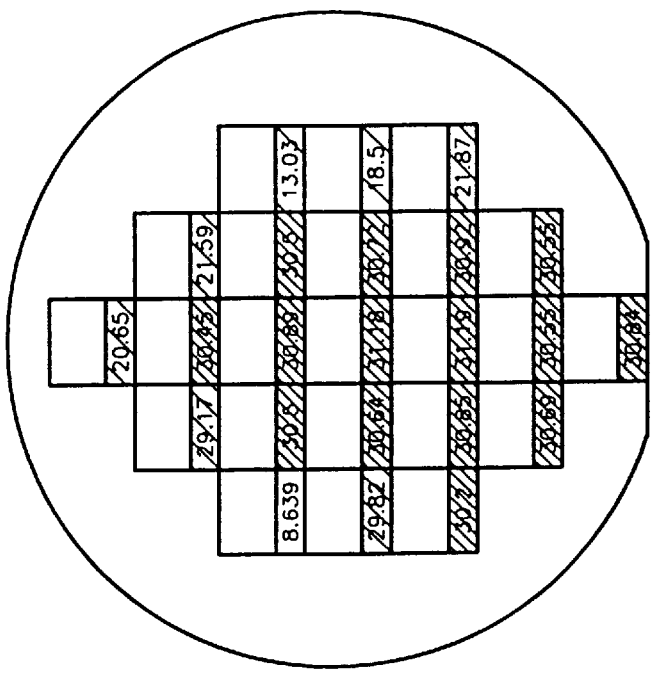
FIG. 10B shows the capacitance of the capacitor-lower electrode formed by the conventional polysilicon film fabricating method, as a contrast group to the fourth embodiment.
Figure 10A:
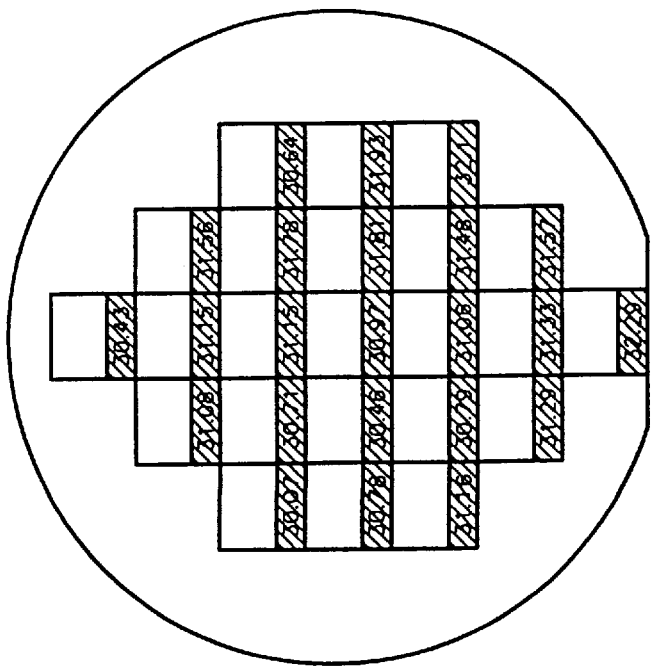
FIG. 10A shows the capacitances of the respective portions of the wafer after forming the capacitor lower electrode by a polysilicon film fabricating method according to a fourth embodiment of the present invention.

FIG. 10A depicts the result of measuring the capacitances of the respective portions of the wafer after forming the lower electrode of the capacitor by controlling the pressure of the cassette chamber to be about 0.05 mtorr and that of the wafer cooling chamber and the wafer transfer chamber to be less than 1 µtorr and controlling the other conditions to be equal to those of Example 1 above.

The capacitances of the respective portions of the wafer after forming the lower electrode of the capacitor by a conventional processing condition using the conventional apparatus is shown in FIG. 10B. The numbers in the respective blocks denote the capacitances. It is noted from FIGS. 10A and 10B that the lower electrodes have a uniform capacitance throughout the whole surface of the wafer when the lower electrode of the capacitor is formed by the present invention.

Figure 11:
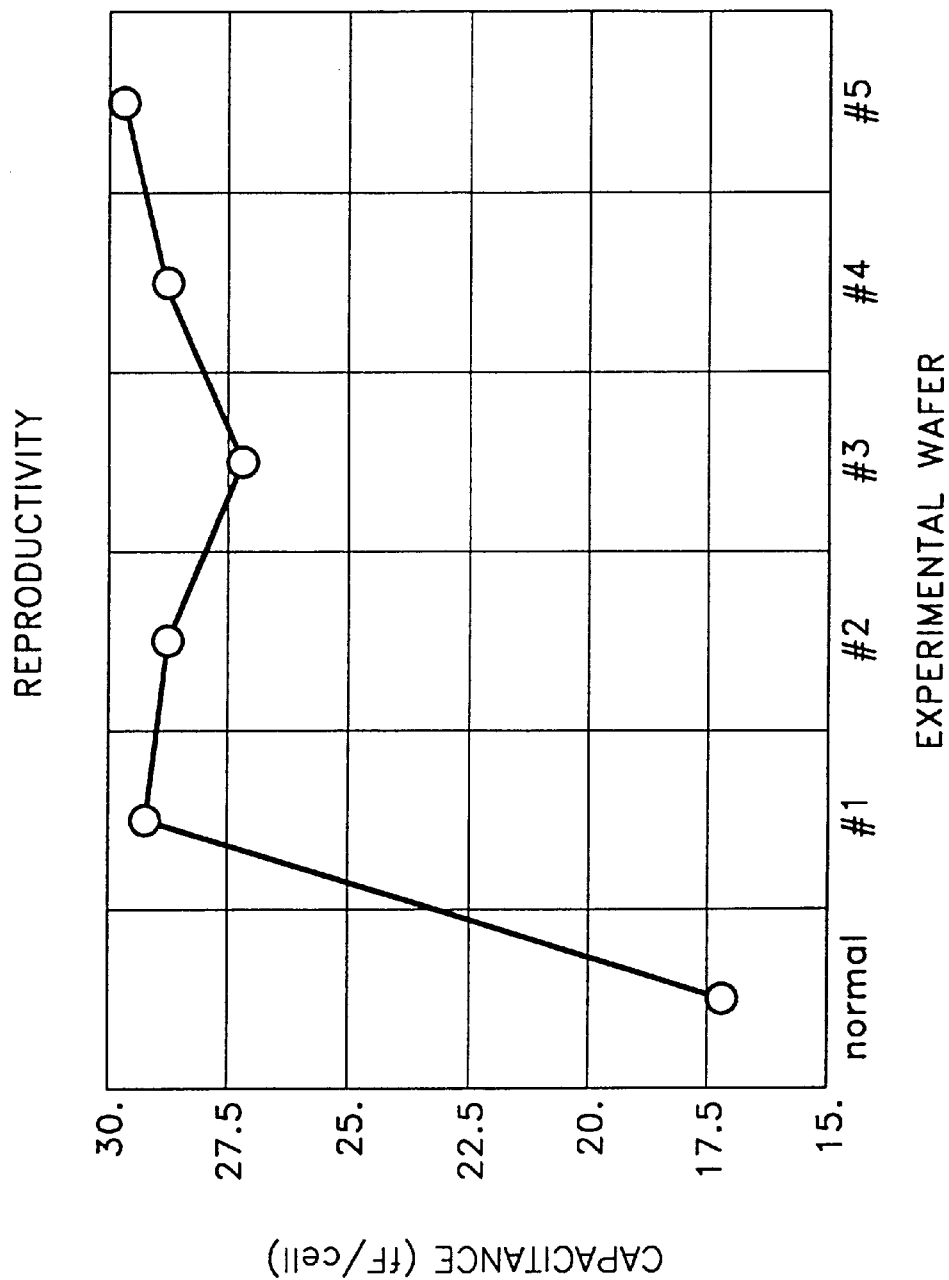
FIG. 11 is a graph showing the reproducability of the process in the case of forming the capacitor by the polysilicon film fabricating method according to the fourth embodiment of the present invention.

FIG. 11 is a graph showing the capacitance measured after continuously performing the process on the five wafers according to the fourth example. When the polycrystalline silicon film is formed using the semiconductor device fabricating apparatus according to the present invention, it is possible to obtain the uniform capacitance result. The reproducability is high compared with the conventional apparatus and method even though the process is continuously performed.

In particular, when the reaction chamber 220 includes all the cooling jackets like the apparatus of FIG. 3 of the present invention, the reliability of the processing performance is improved since it is possible to prevent gas from being exuded in the reaction chamber. Also, when the polycrystalline silicon film is formed using the semiconductor device fabricating apparatus according to the present invention, it is possible to prevent the reduction of the speed of the surface migration of the amorphous silicon due to the contaminants. Therefore, it is possible to repeatedly form a capacitor having high capacitance.

While preferred embodiments of the present invention have been described, it will be understood by those skilled in the art that various changes and modifications may be made, and equivalents may be substituted for elements thereof without departing from the true scope of the present invention. Therefore, it is intended that the present invention not be limited to the particular embodiments disclosed, but that the present invention include all embodiments falling within the scope of the appended claims.

What is claimed is:

1. A method for fabricating a polysilicon film comprising:
   loading a wafer in a cassette chamber;
   maintaining a pressure in the cassette chamber that is less than about 0.05 µtorr;
   transferring the loaded wafer to a reaction chamber through a wafer transfer chamber;
   forming an amorphous silicon film on the wafer by injecting a reactant gas into the reaction chamber;
   transforming the amorphous silicon film into a polysilicon film on which HSG-Si is formed by thermally treating the wafer having the amorphous silicon film formed thereon; and
   transferring the wafer on which the HSG-Si is formed to a cooling chamber for cooling.

2. The method of claim 1, wherein during said forming of an amorphous silicon film, said reactant gas is selected from a group consisting of silane, disilane, and a gas mixture in which a silane:disilane ratio is 30:1 to 1:30.

3. The method of claim 1, wherein the polysilicon film is a lower electrode of a capacitor.

4. The method of claim 1, wherein during said maintaining of a pressure, the pressure of the cassette chamber is adjusted by pumping down of the cassette chamber for ten to thirty minutes.

5. A method for fabricating a polysilicon film comprising:
   loading a wafer in a cassette chamber;
   transferring the loaded wafer to a reaction chamber through a wafer transfer chamber;
   forming an amorphous silicon film on the wafer by injecting a reactant gas into the reaction chamber;
   transforming the amorphous silicon film into a polysilicon film on which HSG-Si is formed by thermally treating the wafer having the amorphous silicon film formed thereon;
   transferring the wafer on which the HSG-Si is formed to a cooling chamber for cooling; and
   maintaining an approximately equal pressure between the cooling chamber and the wafer transfer chamber, the pressure of the cooling chamber and the wafer transfer chamber being less than about 1 0 µtorr.

6. The method of claim 5, wherein during said forming of an amorphous silicon film, said reactant gas is selected from a group consisting of silane, disilane, and a gas mixture in which a silane:disilane ratio is 30:1 to 1:30.

7. The method of claim 5, wherein the polysilicon film is a lower electrode of a capacitor.

8. A method for fabricating a polysilicon film in a multi-chamber including a cassette chamber, a cooling chamber and a wafer transfer chamber, comprising:
   loading a wafer in the cassette chamber;
   transferring the loaded wafer to a reaction chamber through the wafer transfer chamber;
   flowing a refrigerant into first, second, third, fourth and fifth cooling units,
   the first, second, third, fourth and fifth cooling units being respectively mounted on a first sidewall of the reaction chamber adjacent to the wafer transfer chamber, a second sidewall of the reaction chamber opposite to the first sidewall, an upper wall of the reaction chamber, a bottom wall of the reaction chamber, and a gate valve disposed between the reaction chamber and the wafer transfer chamber that separates the reaction chamber from the wafer transfer chamber;
   forming an amorphous silicon film on the wafer by injecting a reactant gas into the reaction chamber;
   transforming the amorphous silicon film into a polysilicon film on which HSG-Si is formed by thermally treating the wafer having the amorphous silicon film formed thereon; and transferring the wafer on which the HSG-Si is formed to a cooling chamber for cooling.

9. The method of claim 8, wherein during said forming of an amorphous silicon film, said reactant gas is selected from a group consisting of silane, disilane, and a gas mixture in which a silane:disilane ratio is 30:1 to 1:30.

10. The method of claim 9, wherein during said loading of a wafer, a pressure of the cassette chamber is adjusted to less than about 0.05 mtorr.

11. The method of claim 10, wherein during said loading of a wafer, the pressure of the cassette chamber is adjusted to less than about 0.05 mtorr by pumping down the cassette chamber for ten to thirty minutes.

12. The method of claim 8, wherein the polysilicon film is a lower electrode of a capacitor.

13. The method of claim 8, wherein during said transferring of the loaded wafer to the reaction chamber and said transferring of the wafer to the cooling chamber, a pressure of the cooling chamber and the wafer transfer chamber is approximately equal.

14. The method of claim 13, wherein the pressure of the cooling chamber and the wafer transfer chamber is less than about 1.0 $\mu$torr.

* * * * *